(12) United States Patent
Schairer

(10) Patent No.: US 6,301,035 B1
(45) Date of Patent: Oct. 9, 2001

(54) COMPONENT FOR OPTICAL DATA TRANSMISSION

(75) Inventor: Werner Schairer, Weinsberg (DE)

(73) Assignee: Vishay Semiconductor GmbH, Heilbronn (DE)

( * ) Notice: Subject to any disclaimer, the term of this patent is extended or adjusted under 35 U.S.C. 154(b) by 0 days.

(21) Appl. No.: 09/104,767

(22) Filed: Jun. 25, 1998

(30) Foreign Application Priority Data

Jun. 28, 1997 (DE) .............................................. 197 27 633

(51) Int. Cl.⁷ .................................................. H04B 10/00
(52) U.S. Cl. .......................................... 359/152; 319/163
(58) Field of Search ................................... 359/152, 153, 359/159, 193, 163

(56) References Cited

U.S. PATENT DOCUMENTS

| | | | |
|---|---|---|---|
| 3,979,587 | 9/1976 | de Cremoux | 250/211 |
| 4,279,465 | 7/1981 | Vojvodich | 350/96.2 |
| 5,122,893 | * 6/1992 | Tolbert | 359/152 |
| 5,617,152 | * 4/1997 | Stolov | 348/761 |
| 6,157,476 | * 12/2000 | Angerstein et al. | 359/152 |

FOREIGN PATENT DOCUMENTS

| | | |
|---|---|---|
| 2523681 | 12/1975 | (DE) . |
| 0471565 | 2/1992 | (EP) . |
| 1466486 | 3/1977 | (GB) . |
| 60-28279 | 2/1985 | (JP) . |

* cited by examiner

*Primary Examiner*—Kinfe-Michael Negash
(74) *Attorney, Agent, or Firm*—W. F. Fasse; W. G. Fasse

(57) ABSTRACT

An infrared transceiver for a directed bi-directional optical data transmission through the air has a single-part or multi-part housing in which a stack of components is mounted as follows: an emitter chip for transmitting IR beams, a detector chip for receiving IR beams, and an optical system with a lens and a reflector having an optical axis for focusing the transmitted and received beams. The reflector is arranged concentrically to the optical axis and relative to the components so that transmission power and reception sensitivity of the IR transceiver are increased.

10 Claims, 2 Drawing Sheets

STATE OF ART

COMPONENT FOR OPTICAL DATA TRANSMISSION

FIELD OF THE INVENTION

The invention relates to an infrared transceiver for a directed bi-directional optical data transmission through the atmosphere. The transceiver is mounted in a single-part or multi-part housing and includes the following components: an emitter chip for transmitting IR beams, a detector chip for receiving IR beams, and an optical system having an optical axis for focusing the transmitted and received beams.

BACKGROUND INFORMATION

Such a transceiver is used for data transmissions in IrDA applications, For data transmission by means of an optical point-to-point transmission route, the IrDA (Infrared Data Association) standard has been developed. For example, integrated transceiver components known by the designation TFDS 3000 or TFDS 6000 are available from TEMIC TELEFUNKEN microelectronic GmbH, which components correspond to the IrDA standard.

Conventionally there are arranged in a common transceiver housing an infrared transmitter (emitter), an infrared receiver (detector), and an integrated circuit for signal processing. A surface of the transceiver component carries two lens-shaped moldings located adjacent to each other, in whose focal points the transmitter and the receiver are respectively located. These optical lens-shaped moldings are necessary in order to achieve the directional signal emission of the transmitter and the directional sensitivity of the receiver as required by the IrDA standard.

Conventional transceivers have the disadvantage that due to the transmitter and the receiver being located adjacent to each other, they each require their own respective optical system in order to be able to achieve the required directional signal transmission of the transmitter and the directional sensitivity of the receiver. This duplication causes high material costs and the dimensions of the transceiver are relatively large.

If the integrated circuit, the receiver, and the transmitter are arranged in a stack, that is, the receiver on the integrated circuit and the transmitter on the receiver, there is a disadvantage in that a part of the receiver element is covered by the transmitter element, thus reducing the receiver sensitivity. Furthermore, due to the way circuit, receiver, and transmitter are arranged, it is not possible—as, for example is possible with light-emitting diodes (LED)—to arrange the transmitter within a cup-shaped reflector; which, due to the undirected radiation, will cause a reduction in transmission power.

SUMMARY OF THE INVENTION

The object of the invention is to provide a component which in spite of smaller dimensions provides a high receiver sensitivity and a high transmission power.

According to the invention there is provided an infrared transceiver for a directed bi-directional optical data transmission through the atmosphere characterized in that in a single-part or multi-part housing are arranged in a stack an integrated circuit: an emitter chip for transmitting IR beams, a detector chip for receiving IR beams, and a lens system having an optical axis for focusing the transmitted and received beams, and in that a reflector is arranged concentrically to the optical axis and relative to the stack including the lens system, so that the transmission power and the reception sensitivity of the transceiver are increased.

The advantages of the invention are that it is possible to use a common optical lens system and reflector for both the transmitter and the receiver, whereby the dimensions of the transceiver are considerably reduced and savings in material costs are achieved. Due to the reflector, the transmission power and the sensitivity of the transceiver are increased by also detecting IR beams coming in from the side and fed to the receiver, and by also radiating outgoing IR beams being emitted by the transmitter, which go past the optical lens system, to the side thereof without necessarily passing through the lens system.

BRIEF DESCRIPTION OF THE DRAWINGS

Two example embodiments of the invention are described in detail below with reference to the accompanying drawings, wherein.

DETAILED DESCRIPTION OF THE PREFERRED EMBODIMENTS AND OF THE BEST MODE OF THE INVENTION

Figure 1:
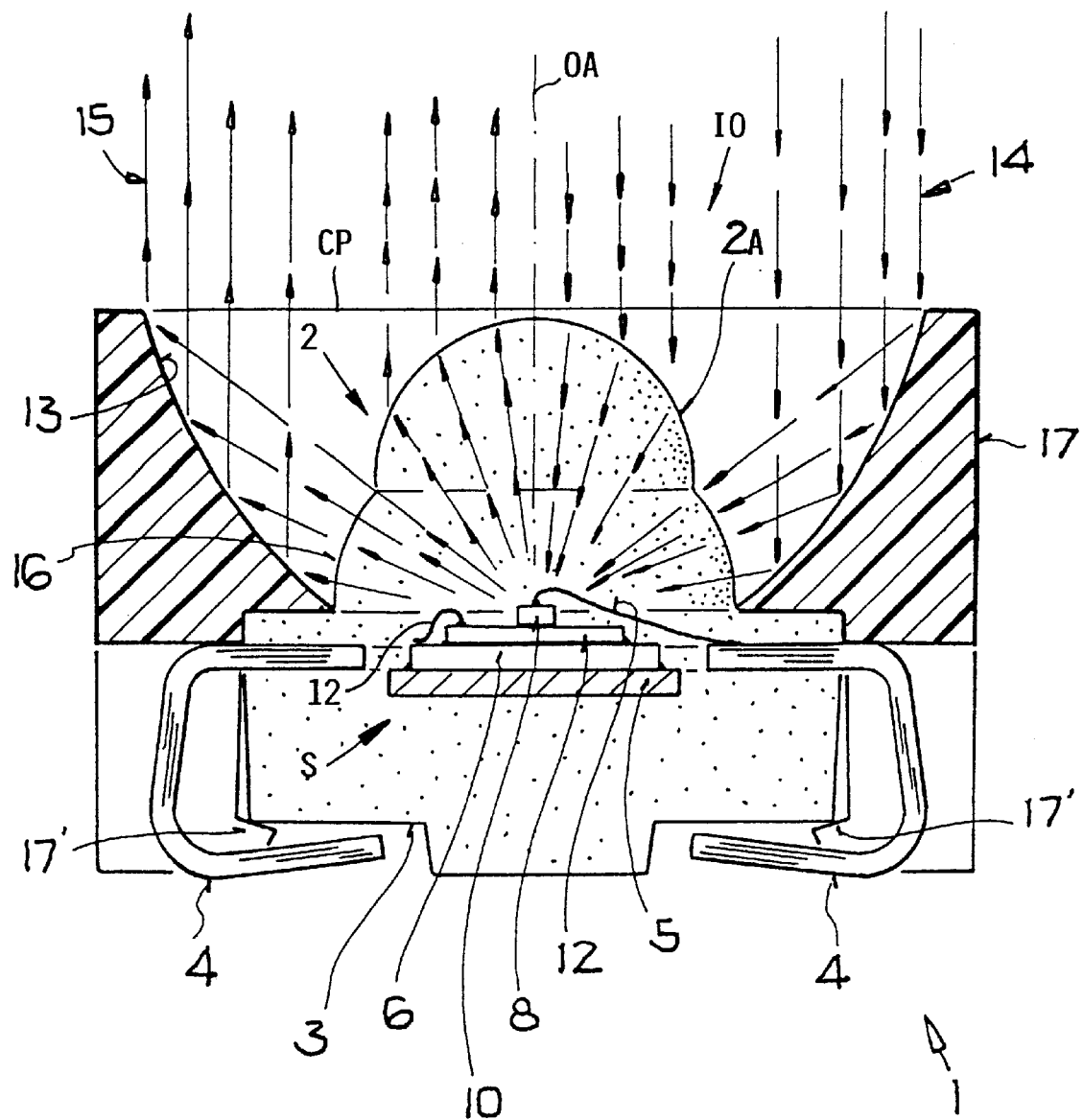
FIG. 1 is a sectional view of a transceiver including a separate reflector.
Figure 2:
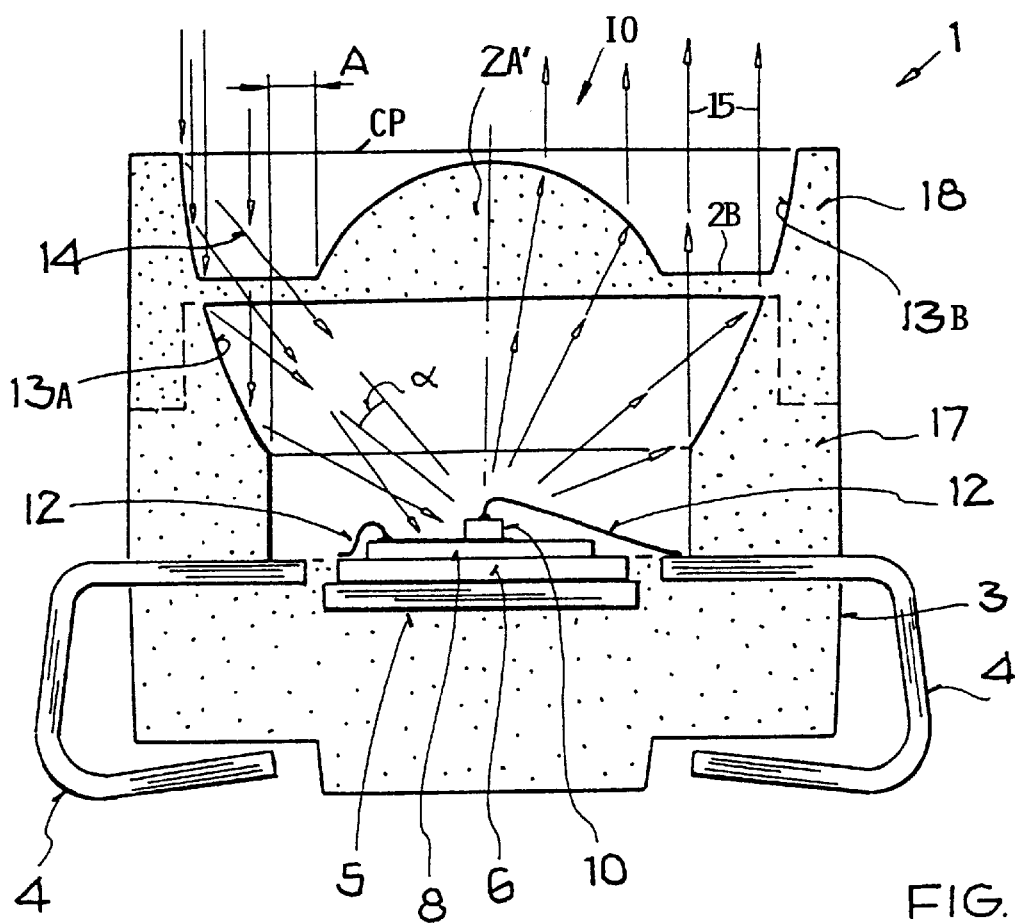
FIG. 2 is a sectional view of the transceiver including an integrated reflector.

FIGS. 1 and 2 show an infrared transceiver 1 including a lens 2 as an optical system, a housing 3 made of, for example, a thermoplastic or thermosetting material and transparent for IR beams. Terminal pins 4 lead to the outside as part of a metallic strip carrier 5. An integrated circuit 6 is mounted on the carrier 5 for amplifying the signals. A photo PIN diode is arranged as a receiver or detector chip 8 on the integrated circuit 6. The photo PIN diode 8 is a special IrDA product, produced by a technology that is standard for photo PIN diodes.

The transmitter or emitter chip 10 is bonded concentrically onto the detector chip 8. Basically, the transmitter or emitter chip 10 is a known infrared transmission diode. The surface area of the integrated circuit 6 is larger than the surface area of the detector chip 8. The surface area of the detector chip 8 is larger than the surface area of the emitter chip 10. A signal transmission between the emitter chip 10 and the integrated circuit 6 or between the detector chip 8 and the integrated circuit 6 is provided by bond wires 12 made of gold, aluminum, or an alloy having good conductive characteristics.

For example, in order to mount the integrated circuit 6 onto the carrier 5, the detector chip 8 onto the integrated circuit 6, and the emitter chip 10 onto the detector chip 8, polyamide adhesive, solder, synthetic solder, or another standard synthetic adhesive are used to form a stack S. In order to ensure that the emitter chip 10 is mounted on the detector chip 8 so that it is conductive, different adhesives or solders may be used respectively for the various individual bonds. The connection between the integrated circuit 6 and the detector chip 8 may be conductive or non-conductive; the non-conductive connection is to be preferred.

FIG. 1 shows the transceiver 1 including a separate reflector housing 17 forming a reflector 13 having a configuration corresponding to a partial paraboloid with a focal point or collection point. For the formation of the paraboloid, a recess or cavity is provided in the rotationally symmetric thermoplastic or thermosetting reflector housing 17. The cavity forms the paraboloid configuration of the reflector 13. The reflector housing 17 is simply fitted over the housing 3 of the transceiver 1, whereby the two housings or housing sections are mounted to each other. Retaining lugs 17' ensure that reflector housing 17 and transceiver housing 3 are held together.

The optical lens system 2 includes a first spherical segment 16 and a second spherical segment 2A. In the simplest case, the two segments form a lens made of synthetic material. The lens 2 and the reflector 13 have been designed and adapted to each other so that radiation 15 coming from the emitter chip 10 will be radiated optimally out of the transceiver. Incoming radiation 14 will be directed optimally to the detector chip 8. This is made possible by the stacking of the detector chip 8 and the emitter chip 10 so that the side-by-side arrangement is avoided. Compared to the state of the art where emitter and detector each require their own optical system, the present arrangement saves a second optical system. Further, the width of the transceiver 1 is reduced approximately to one half of the width of the conventional transceiver 1A shown in FIG. 3.

The reflector 13 is arranged around and coaxially to an optical axis OA of the components 6, 8 and 10 and around the lens 2. Further, the detector chip 8 and the emitter chip 10 are located in the focal or collection point of the reflector 13, whereby, on the one hand, IR beams 14 coming from outside of the lens 2 will be redirected to the detector chip 8. On the other hand, IR beams 15 coming from the emitter chip 10, and bypassing the lens 2 are also radiated outwardly just as beams passing through the lens 2, thereby providing a significant increase in the sensitivity of the transceiver 1 and in the transmission power of transceiver 1.

FIG. 2 shows a further example embodiment of a transceiver 1' including an optical assembly having a housing section 18 comprising a reflector section 13B and a lens 2A' fitted to the housing section 3 including a reflector section 13A. The reflector sections 13A, 13B have a shape corresponding to a partial paraboloid with a focal or collection point. The housing section 3 is also provided with a paraboloid recess forming the reflector section 13A arranged to surround components 6, 8 and 10. The reflector section 13B surrounds the lens 2A. The detector chip 8 and emitter chip 10 are located in the focal or collection point of the reflector sections 13A, 13B. The remaining setup of the transceiver 1', in particular the arrangement of the integrated circuit 6, the detector chip 8, the emitter chip 10 and the lens 2A' is the same as shown in FIG. 1. Further details of FIG. 2 will be described below.

The effect of the reflector sections 13A, 13B is that, on the one hand, IR beams 14 coming from outside the lens 2A' will be redirected to the detector chip 8, and that, on the other hand, IR beams 15 coming from emitter chip 10 and bypassing the lens 2A' are also radiated outwardly. The feature provides a significant increase in the sensitivity of the transceiver 1' and a significant improvement in its radiation behavior.

As due to technical production reasons, a distance A results between the lens 2A' and the reflector 13, a minimum space angle α remains as a so-called "dead space angle". In the space defined by this space angle it is not possible to receive or transmit IR beams. In order to keep this space angle α to a minimum, the smallest possible distance A must be achieved, as the size of the distance A determines the size of space angle α.

FIG. 1 further shows that the housing section 17 has a cavity having the configuration of a paraboloid. Upwardly, the cavity ends in a common reference plane CP extending perpendicularly to the optical axis OA. The upwardly open cavity forms an input/output IO for the transceiver 1 that receives and transmits infrared beams 14 and 15 respectively through the atmosphere. The cavity surfaces are provided with an infrared radiation reflecting surface forming the reflector 13 proper.

FIG. 1 further shows that the optical system 2 comprises a lens having two segments, as mentioned above. The spherical segment 16 and the spherical segment 2A have different diameters. The lens segment 2A has a radius or diameter that is smaller than the radius or diameter of the lens segment 16. As shown, the lens segments 16 and 2A are positioned coaxially in the reflector 13, whereby the lens segment 2A with the smaller diameter is positioned closer to the common plane CP and the lens segment 16 with the larger diameter is positioned closer to the stack S formed by the carrier 5, the integrated circuit 6, the detector 8 and the emitter 10. Thus, incoming reflected infrared beams 14 and outgoing reflected infrared beams 15 must pass at least through the first lens segment 16 as illustrated by the arrows in FIG. 1. Non-reflected incoming and outgoing infrared beams must pass through the first and second lens segments. These features noticeably increase the output and the sensitivity of the transceiver 1.

FIG. 1 also shows that the two lens segments 16 and 2A form an integral part of the housing section 3 while the reflector 13 is an integral part of the housing section 17.

Referring to FIG. 2 there are also two housing sections 3 and 18. The reflector has two sections, namely 13A and 13B. The reflector section 13A is an integral part of a respective cavity in the housing section 3. The reflector section 13B is an integral part of a respective cavity in the housing section 18. FIG. 2 further shows that the lens has a central lens section 2A' and a lens mounting ring 2B, whereby the central lens section 2A' and the mounting ring 2B form an integral part of the housing section 18 to thereby mount the lens in the housing section 18. The central lens section 2A' and the lens mounting ring 2B and the housing section 18 are made of infrared transparent material while the inwardly facing surface of the cavity in the housing section 18 is coated with a reflecting surface coating to form the reflector section 13B. Similarly, the reflector section 13A is a mirror coating on the respective cavity surface in the housing 3. Thus, incoming infrared beams 14 can pass through the lens mounting ring 2B and are also reflected by the two reflector sections 13A and 13B onto the detector chip 8. Outgoing infrared beams 15 are reflected outwardly through the lens mounting ring 2B and through the lens proper. As seen in FIG. 2 the integral component comprising the lens section 2A' the lens mounting ring 2B and the housing section 18 are operatively secured to the first housing section 3, for example by fitting a ring portion of the housing section 18 over a ring extension of the housing section 3 as shown in FIG. 2 by dashed lines.

Figure 3:
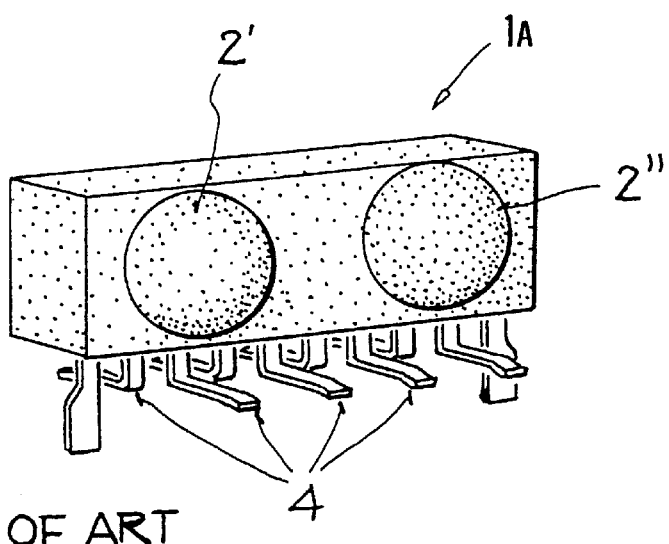
FIG. 3 is a perspective view of a transceiver according to the prior art.

FIG. 3 shows a transceiver 1A according to the state of the art. As the (invisible) detector chip and the emitter chip (also invisible) are located side-by-side, the emitter chip and the detector chip each require their own lens 2' or 2". For this reason, and due to the fact that the terminals 4 of the detector and the emitter are led out separately, the transceiver 1A will increase to twice the width (approximately) when compared to the arrangement according to the invention.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. An infrared transceiver for a bi-directional optical data transmission of directed IR beams through the atmosphere, said infrared transceiver comprising: a housing (3) including an infrared input/output (IO) defining a common plane (CP) facing the atmosphere through which said IR beams pass, said infrared transceiver further comprising a stack (S) mounted in said housing and defining an optical axis (OA) extending perpendicularly to said common plane (CP), said stack (S) comprising in the following order a carrier (5) remote from said common plane (CP), an integrated circuit (6) mounted on said carrier, an IR detector chip (8) secured to said integrated circuit (6) coaxially to said optical axis and facing said common plane, an emitter chip (10) bonded centrally to said detector chip coaxially to said optical axis and facing said common plane (CP) so that said emitter chip (10) is closest to said common plane (CP), an optical lens (2A, 2A') positioned in said housing (3) coaxially to said optical axis (OA) between said stack (S) and said common plane, and a reflector (13) surrounding said stack (S) and said lens (2) in said housing coaxially to said optical axis for reflecting incoming and outgoing IR beams (14, 15).

2. The infrared transceiver of claim 1, wherein said integrated circuit (6) has a first surface area facing said common plane, wherein said detector (8) has a second surface area facing said common plane, wherein said emitter (10) has a third surface area facing said common plane, and wherein said second surface area is smaller than said first surface area and said third surface area is smaller than second surface area.

3. The infrared transceiver of claim 1, wherein said housing comprises a cavity in the form of a paraboloid, and wherein said paraboloid cavity comprises an IR reflecting surface forming said reflector (13).

4. The infrared transceiver of claim 1, wherein said reflector (13) comprises a focal point and wherein at least said emitter chip (10) and said detector chip (8) are arranged in said focal point.

5. The infrared transceiver of claim 1, wherein said reflector (13) is made of a thermosetting or thermoplastic material transparent to IR radiation and forming a paraboloid having an IR radiation reflecting surface.

6. The infrared transceiver of claim 5, wherein said IR radiation reflecting surface is a vapor deposition metal mirror surface.

7. The infrared transceiver of claim 1, wherein said lens comprises a first spherical lens segment (16), and a second spherical lens segment (2A) having a radius smaller than a radius of said first spherical lens segment (16), wherein said first and second lens segments are positioned coaxially in said reflector (13) with said second lens segment (2A) having said smaller radius positioned closer to said common plane (CP) and said first lens segment (16) positioned closer to said stack (S) so that incoming reflected IR beams (14) and outgoing reflected IR beams (15) must pass at least through said first lens segment (16), and wherein non-reflected incoming and outgoing IR beams must pass through said first and second lens segments. (FIG. 1)

8. The infrared transceiver of claim 7, wherein said housing comprises a first housing section (3) and a second housing section (17), said first and second lens sections (16, 2A) forming an integral part of said first housing section (3), and wherein said reflector (13) is an integral part of said second housing section (17).

9. The infrared transceiver of claim 1, wherein said housing comprises a first housing section (3) and a second housing section (18), said reflector comprising a first reflector segment (13A) in said first housing section and a second reflector segment (13B) in said second housing section (18), and wherein said lens comprises a central lens section (2A') and a lens mounting ring (2B) securing said central lens section (2A') in said second housing section (18), wherein said central lens section and said lens mounting ring are made of IR transparent material, so that incoming IR beams (14) passing through said lens mounting ring (2B) are also reflected onto said detector chip (8) and outgoing IR beams (15) are also reflected outwardly through said lens mounting ring (2B). (FIG. 2)

10. The infrared transceiver of claim 9, wherein said central lens section (2A'), said lens mounting ring (2B) and said second housing section (18) form an integral component connectable to said first housing section (3).

* * * * *